US006927584B2

(12) United States Patent
Thinnes

(10) Patent No.: US 6,927,584 B2
(45) Date of Patent: Aug. 9, 2005

(54) CIRCUIT ARRANGEMENT WITH SEVERAL SENSOR ELEMENTS IN MATRIX CIRCUIT DESIGN

(75) Inventor: Martin Thinnes, Trierweiler (DE)

(73) Assignee: IEE International Electronics & Engineering S.A., Echternach (LU)

(*) Notice: Subject to any disclaimer, the term of this patent is extended or adjusted under 35 U.S.C. 154(b) by 0 days.

(21) Appl. No.: 10/472,537
(22) PCT Filed: Mar. 11, 2002
(86) PCT No.: PCT/EP02/02648
§ 371 (c)(1),
(2), (4) Date: Sep. 18, 2003
(87) PCT Pub. No.: WO02/077594
PCT Pub. Date: Oct. 3, 2002

(65) Prior Publication Data
US 2004/0113637 A1 Jun. 17, 2004

(30) Foreign Application Priority Data
Mar. 20, 2001 (LU) .................................. 90745

(51) Int. Cl.$^7$ .............................................. G01R 27/08
(52) U.S. Cl. ....................................... 324/691; 324/713
(58) Field of Search ................................. 324/691, 713, 324/525; 73/862.044

(56) References Cited

U.S. PATENT DOCUMENTS

| 5,276,400 A | 1/1994 | Denyer et al. |
| 5,504,471 A * | 4/1996 | Lund ............................ 338/320 |
| 6,522,155 B2 * | 2/2003 | Pietsch et al. ............... 324/691 |

FOREIGN PATENT DOCUMENTS

| EP | 0 895 091 A | 2/1999 |
| WO | WO 01 18515 | 3/2001 |

* cited by examiner

Primary Examiner—Anjan Deb
Assistant Examiner—Timothy J. Dole
(74) Attorney, Agent, or Firm—McCormick, Paulding & Huber LLP

(57) ABSTRACT

A circuit includes i sensors interconnected in an (n×m) matrix circuit with n row conductors and m column conductors, where i, n, and m are natural numbers different than zero and where $1 \leq i \leq n \times m$, each of the n row and m column conductors include a first and a second conductor end. The first conductor end of the n row conductors and the m column conductors is connectable to an evaluation circuit, and each of the i sensors are connected between two respective conductors from the n row and the m column conductors. A first conductor end of an at least one return conductor is connectable to the evaluation circuit and a second conductor end of the at least one return conductor is in contact with the second conductor end of one of the n row conductors or one of the m column conductors.

10 Claims, 1 Drawing Sheet

CIRCUIT ARRANGEMENT WITH SEVERAL SENSOR ELEMENTS IN MATRIX CIRCUIT DESIGN

CROSS-REFERENCE TO RELATED APPLICATIONS

This application is entitled to the benefit of and incorporates by reference in their entireties essential subject matter disclosed in International Application No. PCT/EP02/02648 filed on Mar. 11, 2002 and Luxembourg Patent Application No. 90 745 filed on Mar. 20, 2001.

FIELD OF THE INVENTION

The present invention relates to a circuit arrangement having a plurality of sensor elements in a matrix configuration.

BACKGROUND OF THE INVENTION

To interrogate, i.e. to read, passive sensor elements, an electrical test voltage is generally applied to the sensor element and the current flowing as a result of the applied voltage is measured. This allows the present electrical state of the sensor element to be calculated and permits the variable which is to be measured (pressure, temperature, etc.) to be ascertained. It should be noted that the passive sensor elements can have a variable resistance, for example, such as pressure-dependent or temperature-dependent resistances, or a variable capacitance. In this context it is clear that the test voltage comprises a DC voltage or an AC voltage, depending on the sensor element's property which is to be measured.

A sensor device having pressure-sensitive sensors can be used, by way of example, in a seat-occupation recognition system for controlling an active passenger hold-back system in a vehicle. Such a sensor mat comprises a plurality of individual pressure-sensitive sensors which are incorporated over the area of the passenger seat, distributed in the seat. The sensors are connected to an evaluation unit which checks the trigger state of the individual sensors. If the seat is being occupied by a person, a plurality of the sensors are triggered on account of the natural weight exerted on the seat by a person, a fact which is recognized by the connected evaluation circuit as being a state of occupation of the seat, and which is forwarded to the airbag controller.

To be able to interrogate the sensors selectively, each of the sensors needs to be connected to the evaluation circuit in principle. To reduce the number of connecting lines for this, it is advantageous to operate the individual sensors in a matrix configuration. This means that, with a number of n*m sensor elements, essentially n row conductors and m column conductors are provided, with one of the sensor elements being connected between a row conductor and a column conductor, respectively. It should be noted in this context that such a matrix configuration represents a circuit arrangement. That is to say that a matrix configuration in a real arrangement requires neither the sensor elements to be arranged in a regular grid distribution nor the individual connecting conductors to run rectilinearly and parallel or at right angles to one another.

To evaluate a sensor arrangement in a matrix configuration, the procedure is as follows: first, the entire matrix configuration with the exception of a first column conductor is connected to the same potential, e.g. to ground. A test voltage is now applied to the first column conductor and then the current flowing away on the individual row conductors is measured selectively. This allows the resistance values of the sensor elements connected between the first column conductor and the various row conductors to be ascertained selectively. If this procedure is repeated for each of the column conductors, all the sensor elements can be selectively tested in succession. It should be noted at this point that it is alternatively possible to apply the test voltage to the individual row conductors and to measure the current flowing away via the sensor elements on the column conductors in order to interrogate the individual sensor elements.

If such a circuit arrangement having sensor elements is used in safety-related areas, such as in the airbag controller described above in a vehicle, it is essential to be able to recognize and, if appropriate, compensate for any malfunction in the circuit arrangement on account of a fault in the conductor. In a simple matrix configuration, the result of a conductor break is, by way of example, that all the sensor elements downstream of the conductor break (seen from the evaluation circuit) can no longer be read. If the conductor break is not recognized by the evaluation circuit, then such a fault results in the conclusion that the sensor elements in question have not been triggered and therefore the actual seat-occupation situation is interpreted incorrectly. Suitable means therefore need to be provided which at least allow the occurrence of a fault to be recognized.

For this purpose, EP-A-0 895 091 proposes a circuit arrangement in which, besides the n row conductors and the m column conductors, an additional row conductor and an additional column conductor are respectively provided. In this case, the free ends of the m column conductors are connected to the additional row conductor via a respective monitoring resistor, and the free ends of the n row conductors are connected to the additional column conductor via a respective monitoring resistor. Following the selective reading of the n*m sensor elements, the monitoring resistors between the individual column conductors and the additional row conductor and between the individual row conductors and the additional column conductor are read. If it is not possible to read one of the monitoring resistors, the test system can conclude that a conductor has broken in the row conductor or column conductor leading to the monitoring resistor. The appropriate row or column can then be deactivated by the evaluation circuit, so that incorrect interpretation of the seat-occupation situation is prevented.

A drawback of this apparatus is that, when a conductor break is recognized, the entire column or row affected by this conductor has to be deactivated and is therefore no longer available for actual situation recognition. This impairs the resolution of the sensor device, however.

OBJECTS AND SUMMARY OF THE INVENTION

It is therefore an object of the present invention to propose a circuit arrangement of the generic type which can be used to compensate for a fault in an interconnect as far as possible.

DETAILED DESCRIPTION OF THE PREFERRED EMBODIMENT

The invention achieves this object by means of a circuit arrangement having i sensor elements which are interconnected in an (n×m) matrix circuit configuration having n row conductors and m column conductors, where i, n and m are natural numbers different than zero and where $1 \leq i \leq n*m$, where a first conductor end of the n row conductors and m column conductors can be connected to an evaluation circuit and where each of the i sensor elements is connected between two respective conductors from the row conductors and column conductors. In line with the invention, the arrangement also comprises at least one return conductor whose first conductor end can be connected to the evaluation circuit and whose second conductor end is in contact with the second conductor end of one of the row or column conductors. In the case of the inventive circuit arrangement, at least one of the row or column conductors is accordingly returned to the evaluation circuit which is to be connected. If the returned row or column conductor suffers a line break, the sensor elements which are in contact upstream of the break in the line can be read by the actual row or column conductor, while the sensor elements which are in contact downstream of the break (seen from the evaluation circuit) can be read via the return conductor. In this way, all the sensor elements connected to the respective conductor can continue to be addressed after a line break and are thus still available for the actual determination of the situation.

It should be noted that, in one advantageous embodiment of the circuit arrangement, all of the row and column conductors which are present can be returned to the evaluation circuit by means of associated return lines. Depending on the use of the circuit arrangement, however, it can be necessary to return just single row or column conductors or else single groups of these conductors. It should also be noted that the invention relates both to circuit arrangements in which all the sensor elements are connected between a row conductor and a column conductor, respectively, and to circuit arrangements in which some of the sensor elements are connected between two column conductors or between two row elements, respectively. Such an arrangement is described in LU-A-90 437, for example.

In one variant of the invention, the first conductor end of the return conductor and the first conductor end of the contacted row or column conductor can be actuated in parallel by the evaluation circuit. In the case of this embodiment, reading can take place downstream of all of the sensor elements connected to the respective row or column conductor without any conductor break being detected. The simultaneous actuation of the return conductor and of the associated row or column conductor can be achieved by making contact with the first conductor ends of the two conductors, for example. In this case, the number of connections in the circuit arrangement is not increased by introducing the return conductors.

In one alternative embodiment, the first conductor end of the return conductor and the first conductor end of the contacted row or column conductor can be actuated separately by the evaluation circuit, i.e. each of the first conductor ends of the row or column conductor and of the return conductor can be connected to the actuation apparatus separately. In such a embodiment, the return conductor can be actuated, by way of example, only if one of the sensor elements connected to the returned row or column conductor is not producing a signal during the actual interrogation. If the sensor element in question is then interrogated via the return conductor and if the evaluation circuit receives a signal corresponding to a switching state in this context, clear inference of the existence of an interconnect break is possible. This state can be stored in an error store by the evaluation circuit, for example, and, in the case of a seat-occupation sensor for a vehicle, can be indicated to the driver by means of a warning light if appropriate. If no signal is measured when the sensor element in question is interrogated via the return conductor, then the alternatives are that the sensor element has not been triggered, is faulty or that both lines reveal a line break. In this case, it is accordingly not possible to make a clear statement about the state of the circuit arrangement.

In one particularly advantageous embodiment of the invention, the circuit arrangement therefore has an additional row conductor, with the second conductor end of at least one column conductor, preferably of all the column conductors, being in contact with the additional row conductor. In this case, the contact can be made by means of a resistor element, for example. This embodiment allows both the returned column conductor and the associated return conductor to be checked by checking the respective resistance for the additional row conductor. This allows clear establishment of whether and, if appropriate, in which conductor a line break has occurred.

In order to ensure the monitoring function of the arrangement in the event of a line break in the additional row conductor, the arrangement preferably has a return conductor whose first conductor end can be connected to the evaluation circuit and whose second conductor end is in contact with the second conductor end of the additional row conductor.

In a similar manner to the additional row conductor, the circuit arrangement can also have an additional column conductor, with the second conductor end of at least one row conductor being in contact with the additional column conductor. In this case too, the contact is made by means of a resistor element, for example, and there is advantageously a return conductor whose first conductor end can be connected to the evaluation circuit and whose second conductor end is in contact with the second conductor end of the additional column conductor.

BRIEF DESCRIPTION OF THE DRAWINGS

The text below describes an embodiment of the invention with reference to the appended figures, in which.

DETAILED DESCRIPTION OF THE INVENTION

Figure 1:
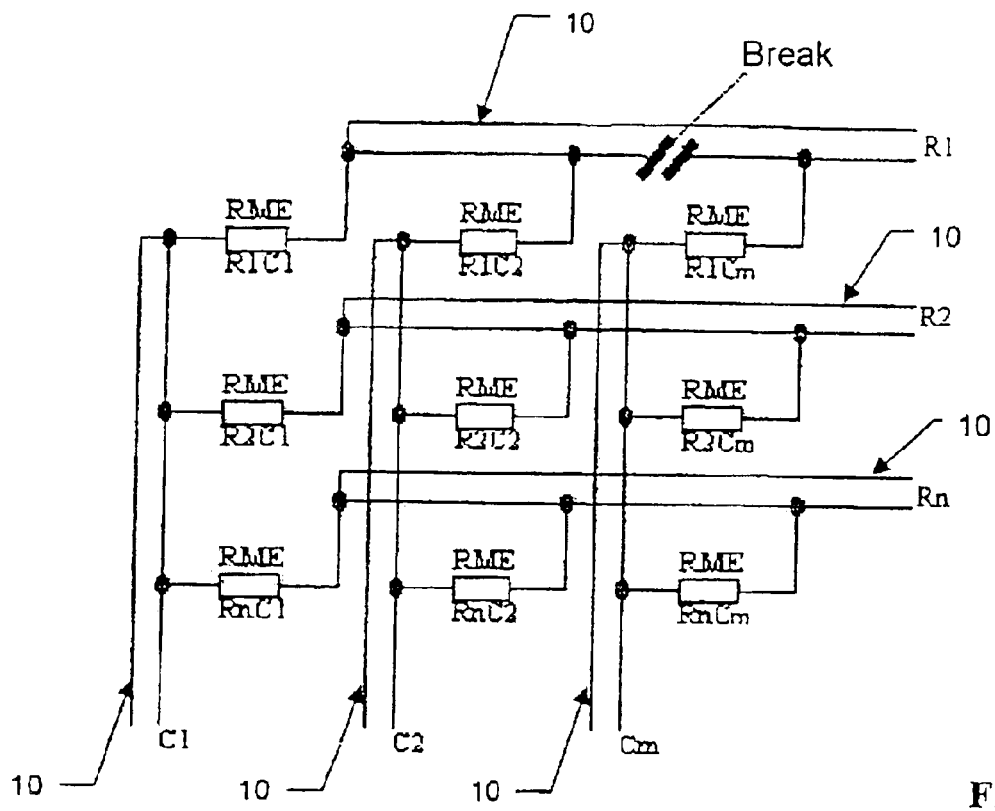
FIG. 1: shows a first embodiment of a circuit arrangement in accordance with the invention, with every row conductor and every column conductor returned.

A first embodiment of the inventive circuit arrangement is shown in FIG. 1. The circuit arrangement comprises a multiplicity of row conductors R1, R2, . . . , Rn and a multiplicity of column conductors C1, C2, . . . , Cm, between which a respective sensor element RME is connected. Each of the row or column conductors has an associated return conductor which is used to return the respective conductor to an evaluation circuit (not shown).

This circuit arrangement allows sensor elements RME still to be interrogated even when an interconnect is severed. In FIG. 1, the row conductor R1 is broken. In this case, the break is between the points of contact between the row conductor R1 and the column conductors C2 and Cm. In a conventional circuit arrangement, the result of such a break in an interconnect is that the sensor elements R1C1 and R1C2 can no longer be interrogated. In the embodiment shown, this is not the case, since the two sensor elements in question can be interrogated via the return line 10 associated with the row conductor R1.

Figure 2:
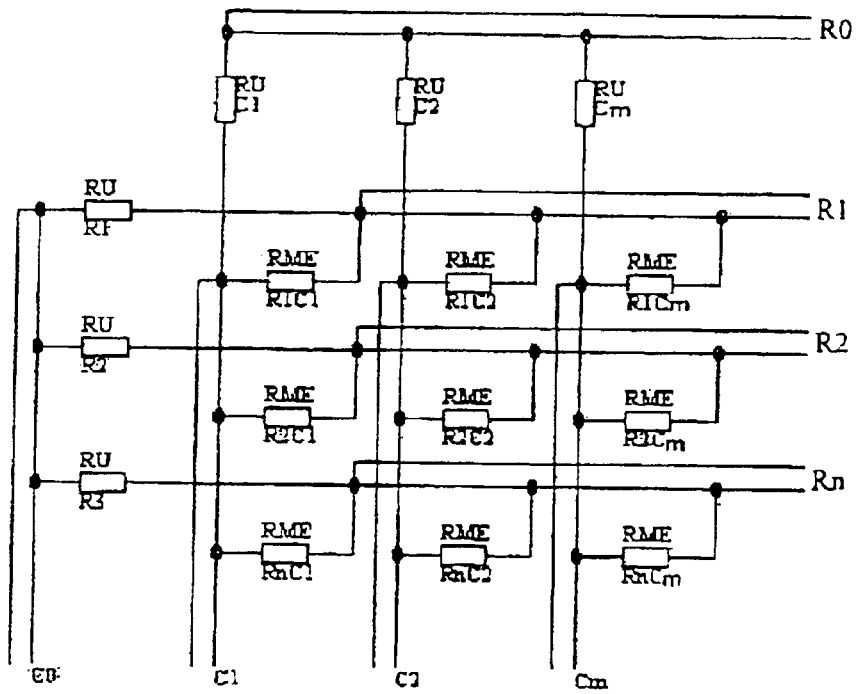
FIG. 2: shows an embodiment of the invention with monitoring resistors.

One particularly advantageous embodiment of the invention is shown in FIG. 2. This figure shows a circuit arrangement in which, additionally, monitoring resistors RU are respectively connected between the column conductors C1, C2, . . . , Cm and an additional row conductor R0 and between the row conductors R1, R2, . . . , Rn and an additional column conductor C0.

This embodiment allows both a returned column or row conductor and the associated return conductor to be checked by checking the respective resistance for the additional row or column conductor. This allows clear establishment of whether and, if appropriate, in which conductor a line break has occurred.

What is claimed is:

1. A circuit arrangement comprising i sensor elements, said i sensor elements being interconnected in an (n×m) matrix circuit configuration with n row conductors and m column conductors, where i, n and m are natural numbers different than zero and where $1 \leq i \leq n*m$, each of said n row conductors and m column conductors comprising a first conductor end and a second conductor end, wherein said first conductor end of the n row conductors and m column conductors is connectable to an evaluation circuit, and wherein each of said i sensor elements is connected between two respective conductors from said n row conductors and said m column conductors, said circuit arrangement further comprising at least one return conductor having a first conductor end and a second conductor end, wherein said first conductor end of said at least one return conductor is connectable to said evaluation circuit and said second conductor end of said at least one return conductor is in contact with said second conductor end of one of said n row conductors or one of said m column conductors.

2. The circuit arrangement as claimed in claim 1, wherein the first conductor end of the return conductor and the first conductor end of the contacted row or column conductor can be actuated in parallel by the evaluation circuit.

3. The circuit arrangement as claimed in claim 1, wherein the first conductor end of the return conductor and the first conductor end of the contacted row or column conductor can be actuated separately by the evaluation circuit.

4. The circuit arrangement as claimed in claim 1, further comprising an additional row conductor, said additional row conductor being in contact with the second conductor end of at least one column conductor.

5. The circuit arrangement as claimed in claim 4, wherein the contact is made by means of a resistor element.

6. The circuit arrangement as claimed in claim 4, comprising a return conductor having a first conductor end and a second conductor end, wherein said first conductor end of said return conductor is connectable to the evaluation circuit and said second conductor end of said return conductor is in contact with the second conductor end of the additional row conductor.

7. The circuit arrangement as claimed in claim 1, comprising an additional column conductor, said additional column conductor being in contact with the second conductor end of at least one row conductor.

8. The circuit arrangement as claimed in claim 7, wherein the contact is made by means of a resistor element.

9. The circuit arrangement as claimed in claim 7, comprising a return conductor having a first conductor end and a second conductor end, wherein said first conductor end of said return conductor is connectable to the evaluation circuit and said second conductor end of said return conductor is in contact with the second conductor end of the additional column conductor.

10. A circuit arrangement comprising i sensor elements, said i sensor elements being interconnected in an (n×m) matrix circuit configuration with n row conductors and m column conductors, where i, n and m are natural numbers different than zero and where $1 \leq i \leq n*m$, each of said n row conductors and m column conductors comprising a first conductor end and a second conductor end, wherein said first conductor end of the n row conductors and m column conductors is connectable to an evaluation circuit for determining an electrical output from each of said i sensor elements, and wherein each of said i sensor elements is connected between two respective conductors from said n row conductors and said m column conductors, said circuit arrangement further comprising at least one return conductor having a first conductor end and a second conductor end, wherein said first conductor end of said at least one return conductor is connectable to said evaluation circuit and said second conductor end of said at least one return conductor is in contact with said second conductor end of one of said n row conductors or one of said m column conductors.

* * * * *